US011489126B2

(12) United States Patent
Akkerman et al.

(10) Patent No.: US 11,489,126 B2
(45) Date of Patent: Nov. 1, 2022

(54) PROTECTION OF FOLDABLE ELECTRONICS

(71) Applicant: Nederlandse Organisatie voor toegepast-natuurwetenschappelijk onderzoek TNO, 's-Gravenhage (NL)

(72) Inventors: Hylke Broer Akkerman, Rosmalen (NL); Petrus Cornelis Paulus Bouten, Eindhoven (NL); Ahmed Fawzy, Eindhoven (NL); Venkata Krishna Pradeep Panditha, Eindhoven (NL); Joris Franciscus Johannes De Riet, Eindhoven (NL); Raghu Kishore Pendyala, Hyderabad (IN)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 78 days.

(21) Appl. No.: 17/055,324

(22) PCT Filed: May 28, 2019

(86) PCT No.: PCT/NL2019/050307
§ 371 (c)(1),
(2) Date: Nov. 13, 2020

(87) PCT Pub. No.: WO2019/231319
PCT Pub. Date: Dec. 5, 2019

(65) Prior Publication Data
US 2021/0193942 A1 Jun. 24, 2021

(30) Foreign Application Priority Data
May 29, 2018 (EP) .................................... 18174948

(51) Int. Cl.
*H01L 51/00* (2006.01)
*H01L 27/32* (2006.01)

(52) U.S. Cl.
CPC ...... *H01L 51/0097* (2013.01); *H01L 27/3244* (2013.01); *H01L 2251/5338* (2013.01); *H01L 2251/558* (2013.01)

(58) Field of Classification Search
None
See application file for complete search history.

(56) References Cited

U.S. PATENT DOCUMENTS 8,598,787 B2 * 12/2013 Bouten ............... H01L 27/3251
313/506
2012/0157804 A1 6/2012 Rogers
(Continued)

FOREIGN PATENT DOCUMENTS

CN 105826485 A 8/2016
CN 106409150 A 2/2017
(Continued)

OTHER PUBLICATIONS

European Patent Office, International Search Report in corresponding International Application No. PCT/NL2019/050307, dated Oct. 1, 2019 (2 pages).
(Continued)

*Primary Examiner* — J. E. Schoenholtz
(74) *Attorney, Agent, or Firm* — Leydig, Voit & Mayer, Ltd.

(57) ABSTRACT

A foldable thin film device assembly is provided comprising: a flexible thin film device with a thickness smaller than 50 micrometer. The thin film device has a stack of electroactive layers formed on a substrate. A protective inorganic capping layer caps the stack of electroactive layers and a backside elastomeric layer backs the flexible thin film device. A frontside transparent elastomeric layer covers the flexible thin film device, and backside and frontside flexible layers are dimensioned to mechanically form a neutral line for the protective inorganic layer. The elastomeric material has a Young's modulus smaller than 100 MPa smaller than 100 MPa and thickness larger than 100 micron, with a flexural rigidity equal or larger than the thin film device.

10 Claims, 5 Drawing Sheets

(56) References Cited

U.S. PATENT DOCUMENTS

| | | |
|---|---|---|
| 2012/0165759 A1 | 6/2012 | Rogers |
| 2013/0041235 A1* | 2/2013 | Rogers ................. H05K 1/0283 |
| | | 600/386 |
| 2017/0373275 A1* | 12/2017 | Frantz ................. H01L 51/5259 |
| 2018/0061893 A1 | 3/2018 | Breedlove |
| 2021/0234130 A1* | 7/2021 | Frantz ................. H01L 51/0097 |

FOREIGN PATENT DOCUMENTS

| | | |
|---|---|---|
| TW | 201308714 A | 2/2013 |
| TW | 201541581 A | 11/2015 |

OTHER PUBLICATIONS

National Intellectual Property Administration, PRC, First Chinese Office Action in corresponding Chinese Patent Application No. 2019800360065 dated Jul. 28, 2022 (6 pages).

\* cited by examiner

PROTECTION OF FOLDABLE ELECTRONICS

CROSS-REFERENCE TO RELATED APPLICATIONS

This patent application is a U.S. National Phase of PCT International Application No. PCT/NL2019/050307, filed May 28, 2019, which claims priority to European Application No. 18174948.2 filed May 29, 2018, which are both expressly incorporated by reference in their entireties, including any references contained therein.

FIELD OF INVENTION

The invention relates to flexible thin film devices that are bendable or rollable with a bending radius ≤2 mm.

BACKGROUND

Flexible devices, such as thin-film PV, organic photodetectors, OLED lighting and OLED display are fabricated with thin films in a stack, which are often moisture sensitive. Hence, the devices have to be protected against the ambient. The most sensitive devices are OLEDs and require so-called ultra-barriers where the water vapor transmission rate is <10-6 g/m2/day. Thin film materials that can achieve such barrier properties are inorganic brittle thin films such as silicon nitride (SiN) or aluminium oxide (AlOx). Since these layers are brittle, they can crack upon stretching. The failure strain, i.e., the strain where cracks start to appear in the layer, is typically <1% for these barrier layers and puts a severe constraint on the flexibility of the device. The flexibility of a device on plastic foil is determined by the flexural rigidity D that is defined as $$D \equiv \frac{Eh^3}{12(1-v^2)},$$

Here h is the thickness of the substrate, E is the Youngs Modulus and v is the Poisson ratio. It follows that the flexibility is dependent on:
1. The thickness of the individual layers in the stack. The flexural rigidity (bending stiffness, D) of a layer scales with the third power of the thickness ($h^3$).
2. The Young's Modulus E of the layers in the stack. A higher E value corresponds to a larger stiffness, i.e. flexural rigidity scales linearly with the Young's Modulus.
3. The failure strain of the critical brittle layers in the stack, i.e. when the outer barrier layers have a lower failure strain less bending can be performed.

For a flexible substrate, the strain would be determined by the distance to the 'neutral line', where substrate material is uncompressed.

Depending on the curvature the material above the neutral line is compressed and the material below is stretched.

Figure 1A:
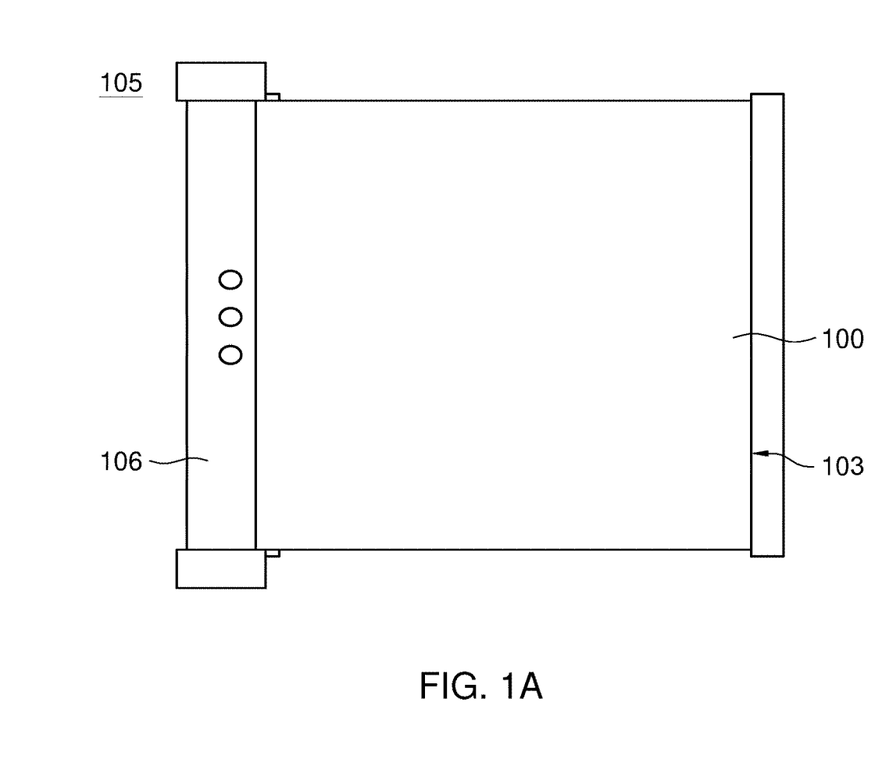
Figure 1B:
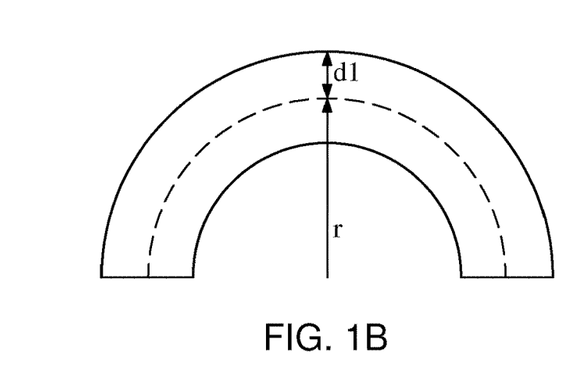

The strain can be expressed as a ratio of the distance d1 in the substrate material relative to the neutral line, and the bending radius of the substrate: strain=(d1+r)/r—see FIG. 1B.

Based on these factors, to achieve foldable thin film devices, i.e., thin film devices that can survive a bending radius ≤2 mm, the substrate has to be very thin.

Figure 1C:
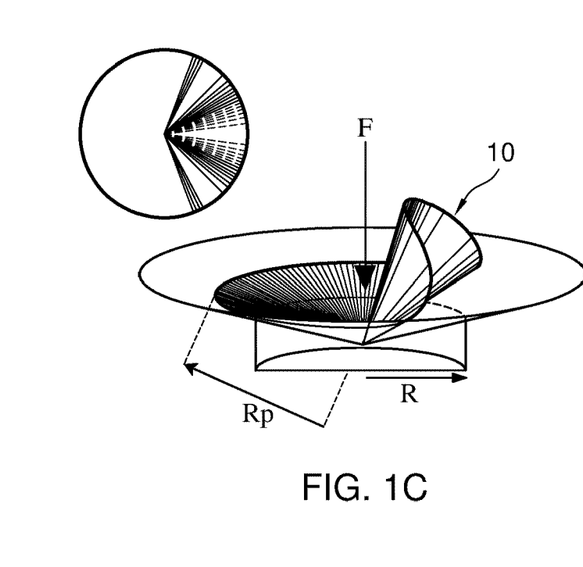

The problem with these very thin devices with a low flexural rigidity is that handling becomes increasingly difficult when they are not supported. In free standing substrates, conical defects are readily formed upon handling, in particular so-called developable cones or d-cones where a high localized strain is present (FIG. 1C). The larger the substrate, the more easily these defects originate somewhere in the foil by handling, as is easily experienced when handling a large sheet of paper. At these locations all the layers in the stack tend to suffer from mechanical damage due to the small local bending radius and in case of OLEDs the devices and barrier layers fail which may result in black spots and shorts. Thus, with large and ultrathin substrates, the substrate will then become very fragile and especially when bending, due to inhomogeneous bending. So called d-cones will emerge that may introduce severe tensile stress in the thin film. One of the objects of the invention is to make thin film foldable devices which survive small bending radii without suffering from d-cone defects due to handling.

It is noted that US20130041235 shows a thin film device having layers of PDMS on the top and bottom to provide a soft, elastomeric encapsulation that offers biocompatibility and provides a barrier to biofluids and surrounding tissue. However the device disclosed there has an array of discrete inorganic semiconductor circuit elements or electrodes, or a combination of inorganic semiconductor circuit elements and electrodes. This configuration is different compared to flexible active pixels in displays or large-area devices based on ultrathin film substrates that have sufficient flexural rigidity for a bending radius ≤2 mm.

SUMMARY OF THE INVENTION

A foldable thin film device assembly is provided comprising: a flexible freestanding thin film device with a thickness smaller than 100 micrometer. The thin film device has a stack of electroactive layers formed on a substrate. A protective inorganic capping layer caps the stack of electroactive layers and a backside elastomeric layer backs the flexible thin film device. A frontside transparent elastomeric layer covers the flexible thin film device having a Young's modulus smaller than 100 MPa and thickness larger than 75 micron, with a flexural rigidity equal or larger than the thin film device.

Upon bending, the inner side of the total stack will exhibit compressive stress and the outer side of the stack will exhibit tensile stress. For example, in conventional OLED devices, substrates are used of about 125 μm (e.g. PEN) with a flexural rigidity of $2.5 \times 10^{-3}$ Nm (2.5.E-03 Nm). The new device has a substrate of 100 μm, resulting in a flexural rigidity of $3.5 \times 10^{-5}$ Nm (5.5.E-05 Nm), 2 orders of magnitude lower.

These and other aspects of the invention will be apparent from and elucidated with reference to the embodiment(s) described hereinafter.

In the drawings:

FIG. 1 (A, B, C) shows a flexible or rollable display screen;

FIG. 3 (A, B) shows exemplary graphs of the strain and flexural rigidity of the new device assembly;

In the Figures, like reference numerals generally refer to like parts. The Figures are not drawn to scale.

FIG. 1A illustrates a thin film device 100 in a rollable display 105. By way of example, the rollable display 105 has a housing 106 e.g. in the form of a stick or cylinder; containing drive electronics and includes a controller or processor as well as a power source such as a battery, e.g. connectable to an electronic apparatus such as a mobile telephone. Other rollable or bendable thin film devices may be partly formed on curved supports or may be only partly bendable in a freestanding—unsupported device configuration. In this example, the device is a display device, but for other applications, such as electro-optic devices etc. the configuration may be equally applicable. The display screen 103 in FIG. 1 provides a large display in the unrolled position (as shown), and can be rolled into the housing 106 when not used, thus providing a small form factor when not in use, and yet a large display when unrolled for use. The thin film device 100 includes a substrate, a plurality of pixels and a plurality of electrodes connecting the pixels to appropriate driver circuitry—further exemplified in subsequent drawings. In the case of an active matrix array display device, the pixels may include thin film transistors as commonly known, which may be of an organic semiconductor material. The pixels have electro-optical display elements, organic semiconductor material such as a light emitting organic polymer or electrophoretic material. These organic materials and the electrodes in contact with the organic semiconductor material are degradable upon exposure to an external environmental factor such as light, air or moisture, i.e., components made of these materials undergo unwanted chemical reactions as a result of their exposure to such factors. These components may also be soft or malleable and subject to damage from abrasion, handling or other physical contact or use.

In FIG. 1C, by way of example a 'd-cone' can be reproduceably formed by pressing a thin film element 10 with a central tip force F in a fixed ring with a diameter R. Prevention of d-cone formation arises in working with extremely thin devices of thicknesses e.g. below 8-10 micrometer. The transition point within the stack where no stress is experienced is called the neutral line. The further away from the neutral line, the more stress is experienced. The new device comprises a stack that is mechanically optimized such that the inorganic capping layer is close to the neutral line and thereby will experience a strain value upon bending below its failure strain.

Often this implies that the neutral line is close to the device level, since similar thin film barriers may be used at the top and bottom, in which case a backside and frontside flexible layer are dimensioned to mechanically form a neutral line close to the device and the protective inorganic layers by controlling the thickness and Young's modulus range of the flexible layer.

Figure 2:
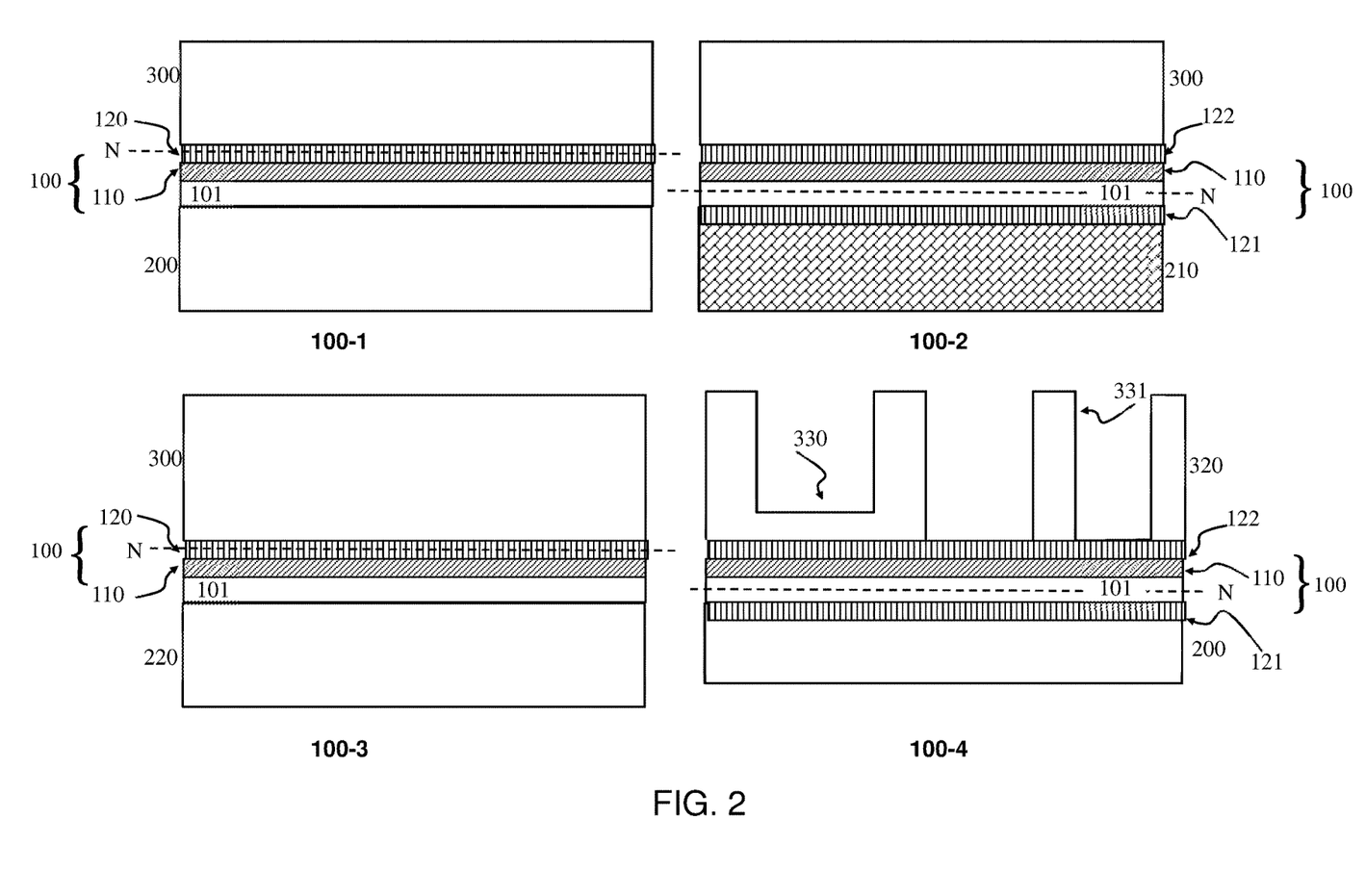
FIG. 2 shows exemplary stacks.

FIG. 2 shows exemplary thin film device assemblies 100-1 . . . 100-4. The thin film device 100 may be a flexible substrate formed from an organic polymer or another suitable flexible material. The substrate may, for example, be made of a flexible polymer material, such as PET, PEN, polyurethane, polyester, polycarbonate or similar materials. The thin film device 100 has a stack 110 of electroactive layers formed on a substrate 101 and a protective inorganic capping layer 120 capping the stack of electroactive layers.

Due to process temperatures required in the fabrication of thin-film encapsulated flexible devices such as OLED displays or PV, processing these devices directly on elastomeric materials is difficult or impossible. Hence, the elastomeric layers 200 and 300 are applied by sticking, gluing or welding, after processing is finished of the thin film device 100 with constituting device layers 110 and capping layers 120.

Device assembly 100-1 shows an exemplary variant with a backside flexible layer 200 backing the flexible thin film device 100; and a frontside transparent elastomeric layer 300 covering the flexible thin film device 100.

Backside and frontside elastomeric layers 200, 300 are dimensioned to mechanically form a neutral line N for the protective inorganic layer 120. This can be done e.g. by matching the respective thicknesses of the layers 220, 300, (see assembly 100-3) with the backside and cover side are of the same material and having different thicknesses. Otherwise one can make use of slightly different flexural rigidities of the constituting flexible layers, by choosing different materials for backside 210 (assembly 100-2) or using fillers. In a typical example the backside and cover side have a flexibility with a Young's modulus ranging between 0.5 and 100 MPa which is highly compressible.

The inorganic layer 120 may be a capping layer that has a water vapor transmission rate that is $<10^{-6}$ g/m$^2$/day (smaller than 10.E-06 g/square meter/day). A typical failure strain for such layer is smaller than 1% due to the extreme brittle character of for example SiN or AlOx thin layers. That is, layers 120 may fail to preserve an integrity on vapor transmission rate above indicated strain threshold of 1-3%, so that the thin film device becomes deficient due to water ingress in the electroactive stack 110.

In some device assemblies, the thin film device 100 may be so thin, that the device may be capped on both sides with a capping layer 121, 122, and be within a strain tolerance of 1% for an assembly 100-2 or 100-4 of flexible front side and backside layers 200, 300 forming a neutral line for the device 100.

Device assembly 100-4 shows a further aspect that the front side and/or back side flexible layers may by covered with a pattern of depressions 330. The depressions may for example be used to allow more light exiting the thin film device 100. The depressions may be in pixelated form or larger patterns. An advantage is that the flexible layer 320 provides its function of limiting the strain exposure for the thin film device, by only having a pattern of flexible strip 331 form or depressions 330. The depressions may be provided by embossing or laser cutting. In some examples, sufficient flexural rigidity may already be formed by strips 331 or very deep depressions 330, which may only serve as an additional soft protection layer.

This pattern of depressions is dependent on the integral flexural rigidity that is needed for providing a strain protection. The depressions 331 may be relatively shallow, very deep or even forming through holes, which may be advantageous for electrical connections. A pitch size of the depression may vary between very fine (e.g. 10 micrometer) to coarse (e.g. 10 mm).

Alternatively, in order to provide a flexible thin film device 100 with a thickness smaller than 50 micrometer electrical contacts to external electronics may be formed in the device stack 100, prior to lamination of flexible layers 200, 300. For example the external electronics connection may be encased in the flexible layers 200, 300. In another scenario the thin film device 100 is larger than the elastomer, such that the contacts for the external electronics are located outside the lamination region and contacts can be made. Another possibility is structuring the elastomer with through holes such that electronic connections can be made to the device. A preference for electrical connection (most often located at the periphery of the active device(s) or array) would be a removal of the elastomer all the way at the edge of the elastomer, creating a structured edge of the laminated layer where the contacts are located in the removed area.

a. in one example, the structuring of the flexible layer may be performed prior to lamination to the thin film device 100. E.g. holes are made by mechanical or laser cutting of the elastomer at the location of either the device, or the electrical contact locations, or both. When laminating the structured flexible layer to the thin film device the structure is aligned to the thin film device 100 and its electrical contacts.

b. in another example, where lamination may be performed over the full area of the thin film device and structuring of the flexible layer is performed afterwards, preferably by laser since a mechanical or thermal process can easily damage the underlying electronics.

i) lamination of the elastomer can be performed in a 2-step process, first at lower temperature with low adhesion between the device/substrate and the elastomer. Afterwards the elastomer may be structured by laser, redundant elastomer may be removed and a final lamination step is performed to achieve a good adhesion for the remaining elastomer.

ii) local deposition of a low adhering layer may be performed at locations where front side parts of the flexible layer should be removed after laser structuring. In this case the elastomer can be laminated over the full area of the thin film device 100, and afterwards laser structured and easily removed together with the layer that has a weak adhesion to the thin film device 100, e.g. contacts formed thereon or on its substrate 101.

iii) Preferably the flexible layer is a transparent elastomer. In cases where e.g. the thin film device 100 is non-transparent, laser structuring can be a difficult, when the laser energy is absorbed in the layers underneath. A dye may be added to the elastomer layer, preferable with an absorption outside the visible range, i.e. UV or (near) infrared absorption and sensitive to the laser wavelength. When laser structuring is performed on the elastomer, laser light is mainly absorbed in the elastomer and structuring can be performed.

Figure 3A:
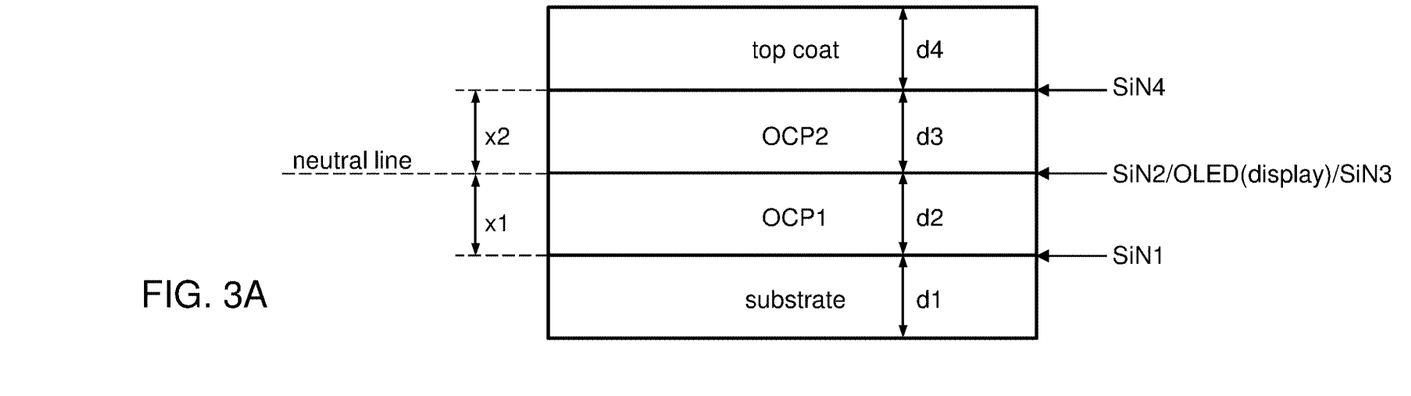

FIG. 3A shows an example of an encapsulated stack of a flexible OLED or OLED thin film device, without the elastomeric layers. The substrate, OCP1, OCP2 layers (organic coating for planarization), and topcoat are typically the mechanical dominating layers in the stack that determine the total thickness and its overall mechanical properties. d1-d4 are typically all >1 µm in thickness. The thin film device further comprises a capping layer typically of SiN, a backplane, and OLED layers that are normally all <<µm in thickness. Hence, their mechanical contribution is minimal. The substrate thickness here is d1. The bottom barrier on foil consists of the stack SiN1/OCP1/SiN2. The OCP layer is introduced to decouple pinholes in the SiN layers and ensure pinhole-to-pinhole diffusion as the dominating mechanism for water ingress and excellent barrier performance [Akkerman, van de Weijer, Organic Electronics, 2017]. On top of the bottom barrier the device is processed. Afterwards a top encapsulation is applied and consisting of SiN3/OCP2/SiN4. A top coat is applied for mechanical protection of the top SiN layer. From a mechanical point of view when discussing flexible or foldable devices, the latter having a bending radius <2 mm, a neutral line close to the device level (between SiN2 and SiN3) is preferred since the electronic part, the device, will in that case not exhibit much mechanical strain upon bending. The position of the neutral line is determined by the combination of individual layer properties, Youngs modulus [E] and thickness [d #]. Upon bending over a certain radius, a strain is experienced in the layers, which increases with distance from the neutral line. The inner side from the neutral line when bending experiences compressive stress, the outer side tensile stress. It is known that (brittle) SiN can experience a tensile stress of ~0.8% before failure. The outer SiN layers (SiN1 and SiN4, at least 1 of these but likely both) will experience most strain upon bending. Hence, for a foldable device, the stack is designed such that the distance x1 (neutral line to SiN1) and x2 (neutral line to SiN4) is minimized to ensure that the strain levels in SiN1 and/or SiN4 upon bending over a certain radius, remain below the failure strain limit. Preferably, for a neutral line close to the device level, x1≈d2 and x2≈d3.

The total thickness of the stack is thus determined by the sum of d1+d2+d3+d4. One would perhaps expect that d1+d2≈d3+d4 to ensure the neutral line is close to device level, however since the Youngs modulus can vary a lot between the different layers, this is not a necessity. A high Youngs modulus thin substrate can be "compensated" on the other side of the neutral line by a thick top coat with a much lower Youngs modulus.

When TPU or an elastomer is applied at the top and/or at the bottom of the presented stack above, its Youngs modulus is very low compared to the other layers in the device stack. The Youngs modulus of an elastomer is typically below 100 MPa, and for the layers above (substrate/OCP/top coat) it is >1 GPa. This implies that to have an effect mechanically, thick elastomer layers are to be applied. This also implies that a shift in neutral line position is minimal when the elastomers are in the same thickness range as the presented layers above or when the elastomers are applied on both sides of the device. In that case the limiting factors upon bending stability, distances x1 anchor x2, remain the same. However, the total stiffness of the stack can be increased with thick elastomeric layers, since the bending stiffness (or flexural rigidity, D) depends on the thickness to the third power ($d^3$) while it scales linearly with Youngs modulus. D-cone defects are prevented due to either an increased flexural rigidity ≥~10-4 Nm or an increased compressive force (>2-3 N) experienced by the outer layer of the elastomer upon bending, when the elastomer increases in thickness. We present below a few numbers on extreme cases and how they relate to Youngs modulus and compressive force.

The stack depicted in FIG. 3A presents a thinnest possible foldable device for production. A starting point for thinnest device is the substrate having thickness d1. For decreasing substrate thickness the difficulty of processing, in particular the difficulty of debonding from a rigid carrier, increases. With the increasing difficulty the yield of perfect devices becomes lower. Hence, we estimate that when working with polyimide layers (the common choice of substrate for OLED displays)<5 µm in thickness, is not realistic in the foreseeable future. A second consideration for thinnest device is the functionality of the OCP in the bottom and top barrier. The OCP may planarize the particles present in the SiN layer underneath to ensure a full decoupling of the pinholes in the two SiN layers on both sides of the OCP. The size and quality of particles can be determined by the processing conditions and environment, but for high yield the OCP layer may be larger than 5 um. Good results can be achieved with 10 um OCP thickness, but smaller than 5 um the functionality of OCP may become problematic. When d1 is set at 5 um, (and Youngs modulus polyimide is ~8 GPa) and d2 is set at 5 um thickness, the thinnest possible device with realistic Youngs modulus range will then consist of d1=d2=d3=d4=5 um, so a total thickness of 20 μm. In the example, when all have a Youngs modulus of ~8 GPa, the flexural rigidity of this stack is D=7.5×10$^{-6}$ Nm. At a bending radius of 0.7 mm (0.7 mm radius for the neutral line level) the strain levels in SiN1 and SiN4 are significantly below the failure strain of SiN. When an elastomer is applied, there are several situations for Youngs modulus that can be chosen, leading to a different minimum thickness to achieve a total flexural rigidity around 10$^{-4}$ Nm. We may choose an extremely low Youngs modulus (0.5 MPa, example PDMS), an intermediate Youngs modulus (23 MPa, Youngs modulus of a tested TPU) and a higher Youngs modulus (100 MPa) to find the limits:

To achieve D≈10$^{-4}$ Nm by applying elastomer on both sides with the above mentioned stack 1:

a. for a Youngs modulus 100 MPa, thickness elastomer: 100 um, compression at ~0.6 mm radius (0.7 mm at neutral line level) is 17%, corresponding to ~2.7 N of force needed for the compression.

b. for a Youngs modulus 23 MPa, thickness elastomer: 160 um, compression at ~0.55 mm radius (0.7 mm at neutral line level) is 26%, corresponding to ~5.1 N of force needed for the compression.

c. for a Youngs modulus 0.5 MPa, within practical limits D≈10$^{-4}$ Nm cannot be achieved. With an elastomer thickness of 500 um, D≈5.6×10$^{-5}$ Nm. The bending radius inside of elastomer will then be 0.2 mm (0.7 mm at neutral line level) and compression is 70%, corresponding to ~22 N of force needed for the compression.

Figure 3B:
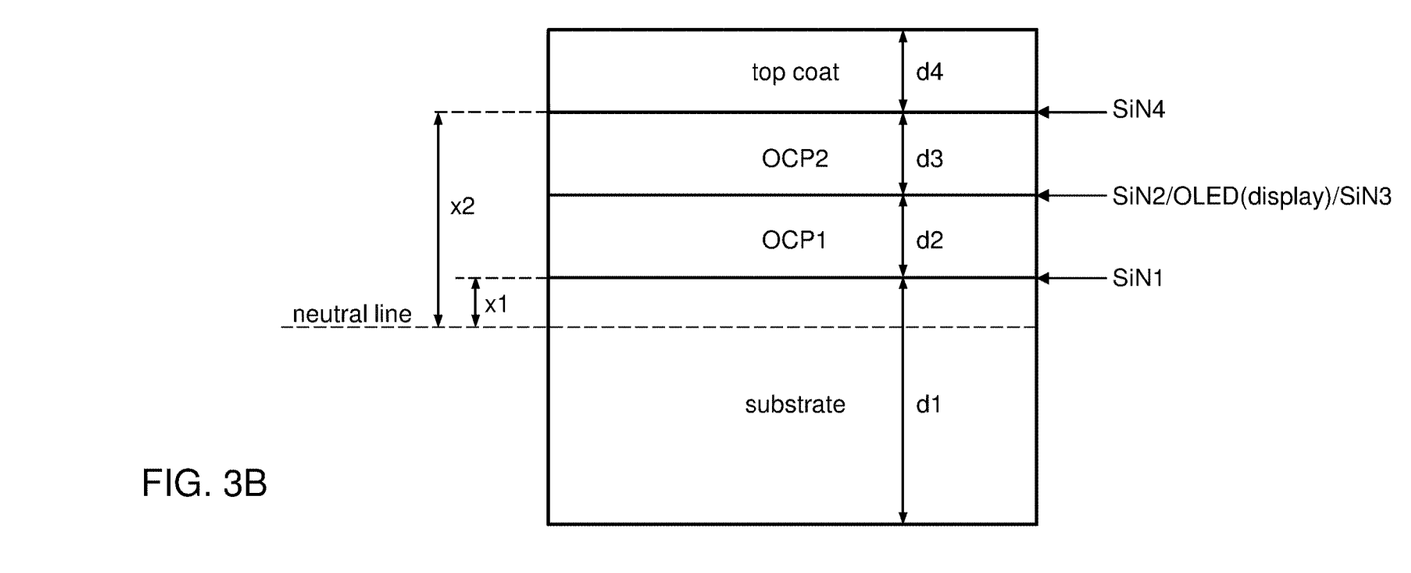

FIG. 3B shows another example where the substrate thickness is larger, e.g. such that the neutral line moves to a level within the substrate. This means that x2 is strongly increased and x2>>d3. This means that upon bending SiN4 will exhibit large strains, resulting in a limited tolerable bending radius and fast damage in SiN4 when the device will be bended over a small bending radius. This may be an example that may illustrate an upper limit of a thin film device having a suitable thickness for production.

To choose a thicker stack with which foldability (bending radius <2 mm) can be achieved, a substrate thickness d1 is chosen, for example, of a PEN substrate with a slightly lower Youngs modulus, and which can be used in terms of temperature stability for the production of OLED displays, albeit in a limited manner. For example, a thickness of 30 μm can be used. In that case OCP1 and OCP2 may be chosen to be 10 μm in thickness and the top coat 60 μm in thickness. The encapsulated device on foil may have a total thickness of 110 μm. The OCP and top coat are chosen to be current materials for this purpose with a Youngs modulus of ~1.1 GPa. In this situation the neutral line may not exactly be in the middle at the device level. Hence the strain experienced by SiN 1 and SiN 4 may not be the same. At a bending radius of 2 mm, the SiN layer with highest strain is still below failure strain. The flexural rigidity of this stack is already >10$^{-4}$ Nm, i.e. D=3×10$^{-4}$ Nm. Hence, applying an elastomeric layer to increase the Youngs modulus above 10$^{-4}$ is not necessary. However, when we want to increase the force needed for bending, we can apply a 23 MPa TPU layer of 250 μm on both sides such that the total thickness will be 610 um and D=8×10$^{-4}$ Nm. At a bending radius of 1.75 mm (2 mm radius at neutral line level) the compression experienced by the outer TPU will be around 15%, corresponding to a 2.3 N force needed for that compression.

Figure 4A:
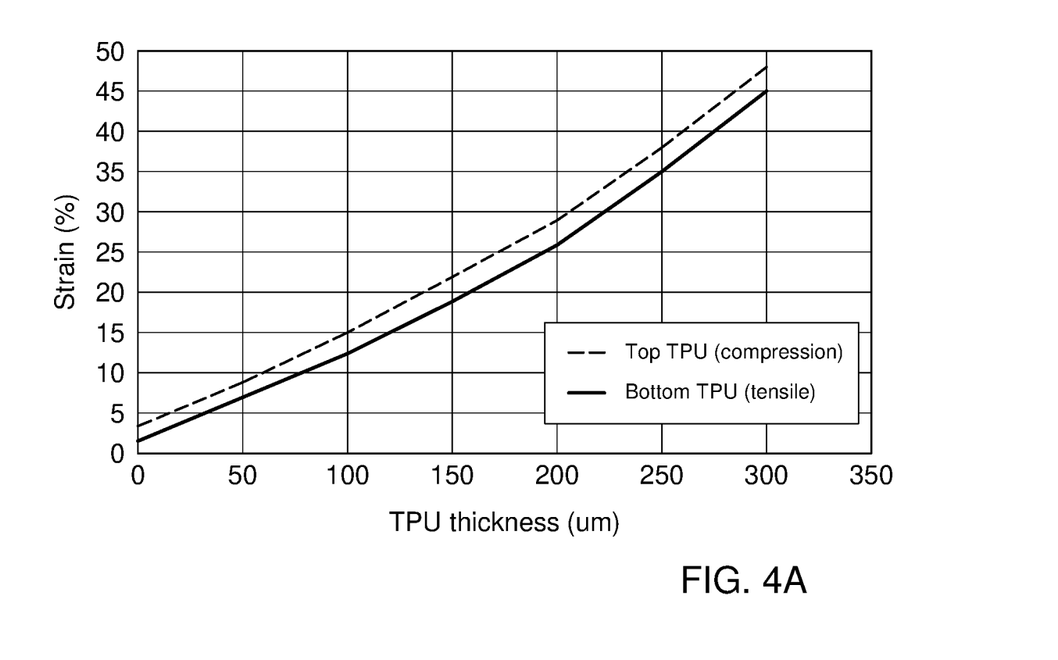
FIG. 4A shows a strain curve calculated for a front side and backside elastomeric layer.

FIG. 4a shows a strain curve calculated for a front side and backside elastomeric layer (thermoplastic polyurethane). For a thicker elastomeric layer the frontside interface of the elastomeric will experience a larger strain value (tensile outside, compressive inside) with increasing thickness.

Figure 4B:
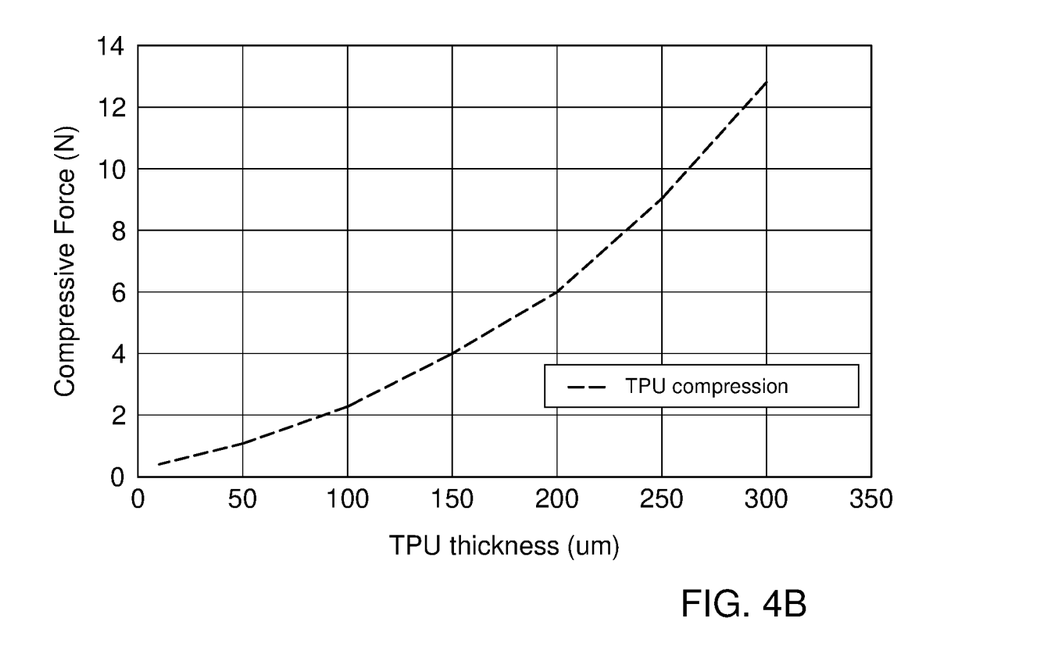
FIG. 4B shows a compressive force curve for backside flexible layer.

With increasing thickness of the elastomeric layer and a foldable OLED at a fixed bending radius on a foldable OLED FIG. 4b shows a compressive force curve for backside flexible layer of the elastomeric layer for increasing thickness of the backside elastomeric layer; at a constant bending radius of about 1 mm. The failure stain level of the outer layer remained intact, below 0.8%

Figure 4C:
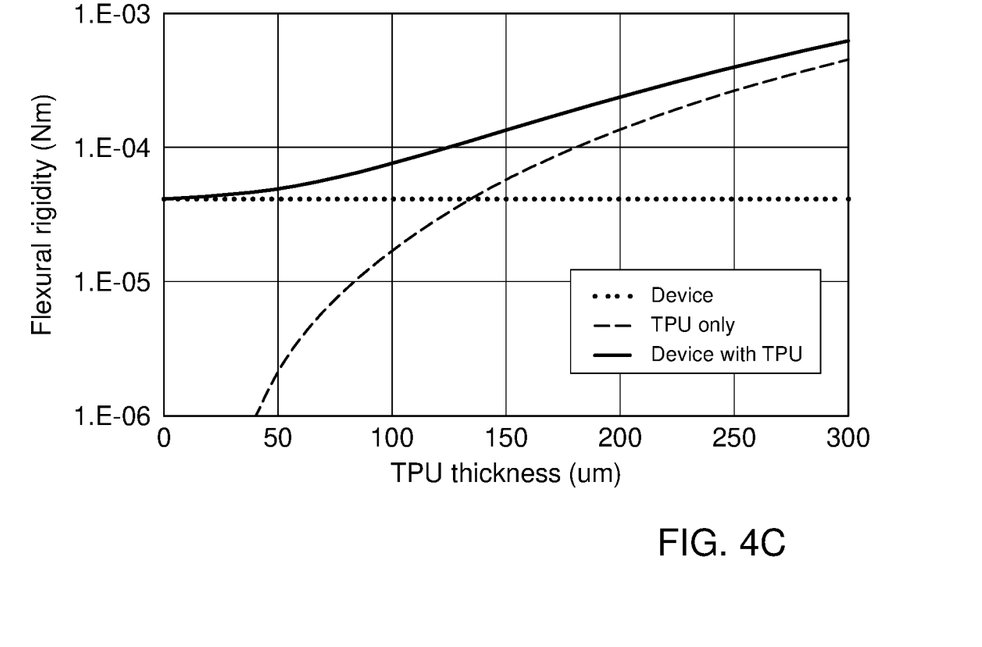
FIG. 4C shows a comparison between the flexural rigidity of a thin film device covered on front and backsides with an elastomeric layer.

FIG. 4c shows a comparison between the flexural rigidity of a thin film device covered on front and backsides with an elastomeric layer, for increasing layer thickness. At a layer thickness around 125 μm for each elastomeric layer, the flexural rigidity of the total stack is about 10$^{-4}$ Nm. Around that thickness is also where the flexural rigidity D of the elastomeric layer and of the device are substantially equal.

Figure 4D:
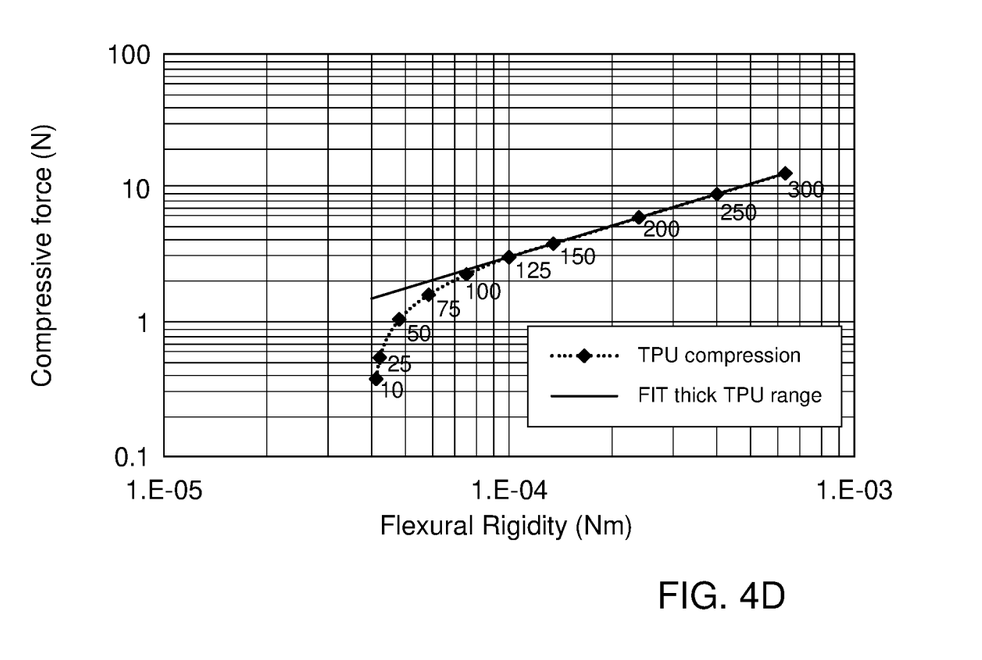
FIG. 4D shows the compressive force experienced by the frontside elastomeric layer plotted versus flexural rigidity.

In FIG. 4d, the compressive force experienced by the frontside elastomeric layer is plotted versus flexural rigidity (b). It can be observed that above a flexural rigidity D of 10$^{-4}$ Nm the compressive force increases about linearly with the flexural rigidity D (on log-log scale) and is dominated by the flexural rigidity of the elastomeric layer. The dotted numbers denote the corresponding layer thickness in micrometer—i.e. ranging from 10 to 300 micrometer, where the device behaves linear for thickness above 100-125 micrometer.

Elastomers are materials that do not respect the Hooke's law, the deformation is not directly proportional to the applied load. An example is TPU—a material known as thermoplastic polyurethane. Elastomers have properties similar to viscoelastic materials. Compared to conventional materials used in technical engineering, the deformation mechanism of elastomers varies greatly. Poisson's ratio of elastomers are typically 0.5 and behave liquid like. Thus, in case of deformation, the initial behaviour of the elastomeric material is almost stress less—while in a further deformed condition, the internal stress of the elastomeric material accumulates, until a point that it balances a deformation force exerted on the substrate. In this way, it prevents the substrate from further deformations with a bending radius tolerance smaller than a given value of e.g. 2 mm, which is determined as a safe value for which the strain of the brittle organic layer is still acceptable to maintain integrity of the layer below the failure strain. The combination of a suitably chosen elastomeric layer and an inorganic layer having a very low failure strain (i.e. extremely brittle) renders these layers robust to handling and deformations for use applications, where substrate areas may be large enough (e.g. larger than 10 cm diameter, or even more than 20 or 40 cm in diameter) where d-cones could emerge due to propagation of deformations over the substrate in spots having bending radii that would be below the radius tolerance limit of e.g. 2 mm or larger or smaller—depending on the failure strain.

The total flexural rigidity (D) is dominated by the elastomeric layer for layer thicknesses above 125 μm, which at the same time corresponds to a thickness above which the compressive force increases linearly on log-log scale with D, i.e. a relatively slow increase. Below this value the compressive force increases much more rapidly. It is found that d-cone formation in such a stack is largely prevented for TPU thicknesses above 100 μm. While it may be still possible to forcibly form d-cones with 100 μm elastomeric layers on both sides, spontaneous formation of d-cones is substantially prevented since the necessary force to provide the smaller bending radii at which the d-cone effect occurs are not realistic in practical use. In this range a flexural rigidity of the total stack ranges from $0.5-50\times10^{-4}$ Nm for these TPU thicknesses.

It is surmised that the increase in compressive force above 2-3 N prevents a formation of spontaneous d-cones; in combination with a flexural rigidity $\geq\sim10^{-4}$ Nm. To give some examples, standard household Al foils are 16 μm thick and have a Young's modulus around 70 GPa. Its flexural rigidity is $2.7\times10^{-5}$ Nm and it easily crumples, i.e., forms d-cones upon handling. For plastic substrates as PI (E=8 GPa) and PEN (E=5.8 GPa) the thickness for a flexural rigidity of $10^{-4}$ Nm is close to 50 μm. This is also the thickness where these foils are much easier to handle. Substrates sizes may be in a range of 10-15 cm×3-15 cm.

It is assumed that when more than a few Newton is required to make a local bending point with a bending radius smaller than the minimum bending radius, the spontaneous formation of local d-cones does not occur and instead is spread to a much larger bending radius over a larger area. The examples above on handling are all for materials with a Young's modulus above 1 GPa. For preferred softer flexible materials, e.g. TPU or PDMS having a Young's modulus (E<<100 MPa), which are easier to deform in-plane, a low flexural rigidity does not lead to very localized d-cones and sharp deformations.

For example for a 250 μm TPU layer with the tradename platilon Young's modules (E=23 MPa), flexural rigidity is $D=3.3\times10^{-5}$ Nm when provided on an OLED thin film device.

Hence, in practical applications of flexible layers of protective elastomer applied to foldable thin film devices, the Young's modulus of the elastomer can vary in the range of 0.5-100 MPa and a thickness in the range of 75-500 μm. For thicknesses below 75 μm the compressive force on the TPU may be too low so that spontaneous localized d-cones still occur. For thicknesses above 500 μm the flexibility of the total stack will be limited by the TPU. This works, for flexible elastomeric layers of a very soft material with a significantly lower Young's modulus than the substrate and a flexural rigidity that is equal or larger than the flexural rigidity of the substrate.

The specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) any of the disclosed devices or portions thereof may be combined together or separated into further portions unless specifically stated otherwise; and e) no specific sequence of acts is intended to be required unless specifically indicated.

The invention claimed is:

1. A foldable thin film device assembly comprising:
a freestanding flexible thin film device with a thickness smaller than 100 micrometers, wherein the freestanding flexible thin film device comprises:
a stack of electroactive layers formed on a substrate; and
a protective inorganic capping layer;
a backside elastomeric layer backing the freestanding flexible thin film device; and
a frontside transparent elastomeric layer covering the freestanding flexible thin film device;
wherein the backside elastomeric and the frontside transparent elastomericers layer are formed of an elastomeric material with:
a Youngs Young's modulus smaller than 100 MPa, and
a thickness larger than 75 micrometer, and
wherein the backside elastomeric and the frontside transparent elastomeric layer each have a flexural rigidity equal or larger than the freestanding flexible thin film device.

2. The foldable thin film device assembly according to claim 1, wherein the protective inorganic capping layer has a water vapor transmission rate $<10^{-6}$ g/m²/day and a failure strain smaller than 1%.

3. The foldable thin film device assembly according to claim 1, wherein the backside elastomeric layer and the frontside transparent elastomeric layer are of a same material and have different thicknesses.

4. The foldable thin film device assembly according to claim 1, wherein the frontside transparent elastomeric layer has a pattern of depressions.

5. The foldable thin film device assembly according to claim 1, wherein the frontside transparent elastomeric layer has a pattern of grid lines with through holes.

6. The foldable thin film device assembly according to claim 1, wherein the frontside transparent elastomeric layer or the backside elastomeric layer is provided with one or more through holes for providing an electrical interconnection with the freestanding flexible thin film device.

7. The foldable thin film device assembly according to claim 1, wherein the backside elastomeric layer and the frontside transparent elastomericers layer have a thickness smaller than 500 micron microns.

8. The foldable thin film device assembly according to claim 1, wherein the backside elastomeric layer and the frontside transparent elastomericers layer have a flexibility with a Young's modulus larger than 0.5 MPa.

9. The foldable thin film device assembly according to claim 1, wherein the backside elastomeric layer and the frontside transparent elastomerice layer form a layer stack having a neutral line, with the protective inorganic capping layer near the neutral line, so as to, when folded, maintain a strain of the one or more protective inorganic capping layers below a failure strain.

10. The thin film device assembly according to claim 1, wherein the thin film is a rollable display screen.

* * * * *